United States Patent [19]
Averill

[11] Patent Number: 5,794,012
[45] Date of Patent: Aug. 11, 1998

[54] VERIFICATION OF STRONGLY ORDERED MEMORY ACCESSES IN A FUNCTIONAL MODEL OF AN OUT-OF-ORDER COMPUTER SYSTEM

[75] Inventor: Gregory S. Averill, Fort Collins, Colo.

[73] Assignee: Hewlett-Packard Company, Palo Alto, Calif.

[21] Appl. No.: 728,338

[22] Filed: Oct. 9, 1996

[51] Int. Cl.$^6$ .................................................. G06F 11/26
[52] U.S. Cl. ........................ 395/500; 395/527; 364/578; 364/264.3
[58] Field of Search ...................... 395/500, 527, 395/672; 364/578, 264.3; 711/141, 147

[56] References Cited

U.S. PATENT DOCUMENTS

| | | | |
|---|---|---|---|
| 4,890,224 | 12/1989 | Fremont | 364/200 |
| 5,133,058 | 7/1992 | Jensen | 395/400 |
| 5,357,628 | 10/1994 | Yuen | 395/575 |
| 5,404,496 | 4/1995 | Burroughs | 395/575 |
| 5,615,357 | 3/1997 | Ball | 395/500 |
| 5,633,812 | 5/1997 | Allen et al. | 364/578 |

OTHER PUBLICATIONS

Thomas B. Alexander et al., "Verification, characterization, and debugging of the HP PA 7200 Processor", Hewlett-Packard Journal, pp. 34-43, Feb. 1996.

Doug Hunt, "Advanced performance features of the 64-bit PA-8000", IEEE, pp. 123-128, 1995.

Mark S. Papamaroose et al., "A low-overhead coherence solution for multiprocessors with private cache memories", IEEE, pp.348-354, 1984.

Thomas B. Alexander et al., "Verification, characterization, and debugging of the HP PA 7200 Processor", Hewlett-Packard Journal, pp. 34-43, 1996.

Doug Hunt, "Advanced performance features of the 64-bit PA-8000", IEEE, pp. 123-129, 1995.

Mark S. Papamaroose et al., "A low-overhead coherence solution for multiprocessors with private cache memories", IEEE, pp. 348-354, 1984.

*Primary Examiner*—Kevin J. Teska
*Assistant Examiner*—Hani Mahmoud Kazimi

[57] ABSTRACT

A system and method for detecting architectural violations of strongly ordered instructions by a computer architecture under test that supports out-of-order instruction execution is presented. A synchronizer concurrently controls the execution of an architectural model, which models high-level architectural requirements of the computer architecture under test and generates correct results under all received instruction test stimuli, and a behavioral model, which models the high-level architectural requirements of the computer architecture under test and executes instruction test stimuli according to the out-f-order instruction execution behavior defined by the computer architecture. The synchronizer matches all out-of-order instruction execution effects. The synchronizer verifies the correct handling of strongly ordered instruction by the computer architecture under test by keeping track of coherency check addresses from the bus emulator to the behavioral model, each memory request issued by the behavioral model to the bus emulator for any memory address other than the coherency check address, each respective move-in of a copy of each memory address, each access of each of the logged memory addresses, and each access of each logged coherency check address. If between the issuance of a coherency check on a coherency check address and a subsequent access of the same coherency check address without a new move-in of the coherency check address, the behavioral model moves in a copy of a memory address and accesses that copy, an architectural violation in handling strongly ordered instructions by the computer architecture under test is indicated.

4 Claims, 5 Drawing Sheets

VERIFICATION OF STRONGLY ORDERED MEMORY ACCESSES IN A FUNCTIONAL MODEL OF AN OUT-OF-ORDER COMPUTER SYSTEM

FIELD OF THE INVENTION

The present invention relates generally to verification methods for testing the operation and design of a computer system, and more particularly, to a system and method for verifying strongly ordered memory accesses in a functional model of an out-of-order computer system.

BACKGROUND OF THE INVENTION

Over the past few years the integrated circuit process technology industry has experienced rapid technological advances. Specifically, the ability to provide ever-increasing density and functionality on a single VLSI chip has resulted in a dramatic growth in chip complexity and continually decreasing chip sizes. In addition, various performance techniques have been developed to increase processor speeds. One such technique is instruction pipelining. Instruction pipelining is known in the art. For a detailed description with particular context to the computer architecture to which the present invention may be used to test and verify, see D. Hunt, *Advanced Performance Features of the 64-Bit PA-8000*, Proceedings of COMPCON '95, Mar. 5–9, 1995, pp. 123–128, incorporated herein by reference. The goal of instruction pipelining is to sustain the execution rate of instructions at a maximum level of completed instructions per clock cycle so as to avoid wasting valuable microprocessor clock cycles while waiting for a prior instruction to complete. One modern technique for maximizing the performance of a microprocessor involves fetching several instructions from an instruction cache or memory at once and storing them in a fast on-chip instruction buffer until execution time. This technique attempts to ensure a continual supply of instructions while hiding memory latency. Another recent technique for sustaining a maximized execution rate of instructions has been to execute instructions out-of-order. Out-of-order instruction execution exploits instruction level parallelism and also allows cache and memory latency to be hidden. When blocked by an instruction that is waiting for data to be returned from memory, out-of-order instruction execution allows the microprocessor to execute instructions located later in the instruction stream which are independent of the blocking instruction and its data. Out-of-order instruction execution reduces the number of instruction pipeline "bubbles" and significantly improves performance.

In out-of-order microprocessors, some accesses to memory space may be designated as "strongly ordered". Strong ordering means that accesses to memory, such as loads and stores, must appear to software as though they were executed in order. In a shared memory multiprocessor system, additional constraints may be placed on the out-of-order execution of each processor in the system. Specifically, strong ordering in multiprocessor systems means that accesses by a given processor appear to that processor as well as to all other processors in the system to be done in program order. If a processor A executes a load instruction and receives the value stored by a store instruction executed on processor B, then processor A is said to have "observed" the store by processor B. If a store by a processor is observed by another processor, then the store is said to be "performed". If no instruction stream running on any other processor in the multi-processor system attempts to observe the strongly ordered accesses performed on a given processor, then that processor may perform the accesses of this instruction stream out of order. However, if any other instruction stream running on any other processor in the system attempts to observe the accesses on a given processor, then that processor must perform its accesses in order. Accordingly, re-ordering the order of instruction execution is architecturally legal if unobserved but illegal if observed.

Generally, for strongly ordered memory accesses, each processor in a shared memory multiprocessor system adheres to an industry standard MESI protocol when accessing and using shared memory. For a detailed description of the MESI protocol, see M. Papamarcos and J. Patel, "A Low Overhead Coherent Solution for Multiprocessors with Private Cache Memories," in Proceedings of the 11th International Symposium on Computer Architecture, IEEE, New York (1984), pp. 348–354, incorporated herein by reference. Under the MESI protocol a processor's cache line may be in one of four states. First, a cache line may be in a "modified" state whereby the processor has exclusive access to the memory location and also the only correct copy in the system. Second, a cache line may be in an "exclusive" state whereby the processor has exclusive access to the memory location and has not yet modified it but may modify it without telling any of the other processors. Once a processor with exclusive access to a memory location modifies a copy of a memory location, the state of the cache line changes from "exclusive" to "modified". Third, a cache line may in a "shared" state whereby the cache line is a merely a copy of the memory location in main memory—i.e., it is an inexclusive copy. Finally, a cache line may be in an "invalid" state whereby the copy of the memory location contained in the cache is no longer valid.

The operation of the MESI protocol is different depending on whether the memory access is a load or a store. When executing a load, a processor must have a copy of the memory location in the cache in either the "modified", "exclusive" or "shared" state. If the cache contains a copy of the memory location in one of these three states, the processor may access the data in the cache without causing any central bus action. If however, the cache either contains an "invalid" copy of the memory location or does not contain a copy of the memory location at all, the processor must issue a nonexclusive data request to the central bus and each other processor in the system must perform a coherency check by indicating to the requesting processor that it has not modified the memory location or by sending the modified copy to the requesting processor. It will be noted that only one processor may have an "exclusive" or "modified" copy.

When executing a store, a processor must have a copy of the memory location in the cache in either the "modified" or "exclusive" state. If the cache contains a copy of the memory location in one of these two states, the processor may modify the copy of the data in the cache without causing any central bus action. If however, the cache either contains a "shared" or "invalid" copy of the memory location or does not contain a copy of the memory location at all, the processor must issue an exclusive data request to the central bus and each other processor in the system must perform a coherency check by indicating to the requesting processor that it has not modified the memory location or by sending the modified copy to the requesting processor.

The use of one or more out-of-order processors in a multi-processor system presents an added level of complexity to the problem of pre-fabrication processor testing and verification. Prior to committing a processor design to be being manufactured in silicon, a behavioral model of the microprocessor is created and tested. Test sequences of instructions are run on the behavioral model and some method is used to determine if the behavior of the model is architecturally correct. The legality of the act of re-ordering instruction execution may only be determined by examining the context of all instruction streams running simultaneously in a multiprocessor system.

One prior solution for testing and verifying the correctness of strongly ordered accesses on a pre-fabrication behavioral model of an out-of-order processor is the use of self-checking code sequences. In this technique, each instruction stream running on each of N processors in an N-way system is designed to have knowledge of all other related accesses that could occur. The final memory state of the system is examined to determine if that state is consistent with the N instruction streams. Self-checking code sequences, however, are cumbersome and difficult to implement in a way that fully exercises the behavioral model of the processor under test. This method imposes structure on test cases that decrease the scope and coverage of the tests. Additionally, not all ordering failures are identified. For example, if the result of an ordering failure is overwritten before the end of the case such that it does not appear in the final state of the memory system, then knowledge of that failure is lost.

Accordingly, an object of the invention is to provide a system and method for testing and verifying a behavioral model of a processor which supports out of order instruction execution which overcomes the limitations of a self-checking code sequence approach. Another object of the invention is to provide a system and method for efficiently testing and verifying that the behavioral model handles strongly ordered instructions correctly, particularly in the context of a multi-processor environment. It is yet another object of the invention to provide a system and method for testing and verifying a behavioral model of a processor which supports out of order instruction execution without requiring knowledge of the instruction streams running on other processors in a multi-processor system.

SUMMARY OF THE INVENTION

In accordance with a preferred embodiment of the invention, there is presented a system and method for testing and verifying a behavioral model of a processor which supports out of order instruction execution, and in particular for testing and verifying the behavioral model of the processor in the context of a multiprocessor environment.

The test system includes an architectural model configured to model the requirements of the computer architecture and a behavioral model configured to model the implementation of the computer architecture. The behavioral model is designed to conform with the computer architecture. The test system also includes a bus emulator configured to model the behavior of a system bus which is coupled to an external system environment. The bus emulator is configured to send and receive control commands and data to and from the behavioral model. The test system also includes a synchronizer configured to control the execution of the architectural model and the behavioral model such that the architectural model and the behavioral model execute concurrently. The synchronizer is configured to match all out of order instruction execution effects and to detect architectural violations by the behavioral model of strongly ordered instructions. The synchronizer is also configured to generate architectural model state control commands for controlling the state of the architectural model and behavioral model state control commands for controlling the state of the behavioral model. The architectural model and said behavioral model receiving a same stream of instructions.

The synchronizer detects architectural violations of strongly ordered instructions in the computer architecture as follows. For each coherent data request by the bus emulator on the central bus that requires a coherency check to be performed by the behavioral model, the synchronizer creates a coherency check record corresponding to the coherency check address and records the coherency check address in the coherency check record. The synchronizer then logs each memory request issued by the behavioral model to the bus emulator for any memory address other than the coherency check address. The synchronizer then logs the return of each of the memory addresses requested. Then each access by the instructions in the instruction stream of each memory address requested are logged. Then each access by the instructions in the instruction stream of the coherency check address are logged. Finally, if between the issuance of the coherency check on the coherency check address and a subsequent access by the instruction stream of the coherency check address without a new move-in of the coherency check address, the behavioral model moves in a copy of a line at a memory address other than the coherency check address and accesses the copy, the synchronizer indicates the occurrence of an architectural violation by the behavioral model in handling strongly ordered instructions.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE PRESENT INVENTION

1. Description

The preferred embodiment of the present invention is discussed below with reference to the drawings, where like reference numbers represent like elements.

Figure 1:
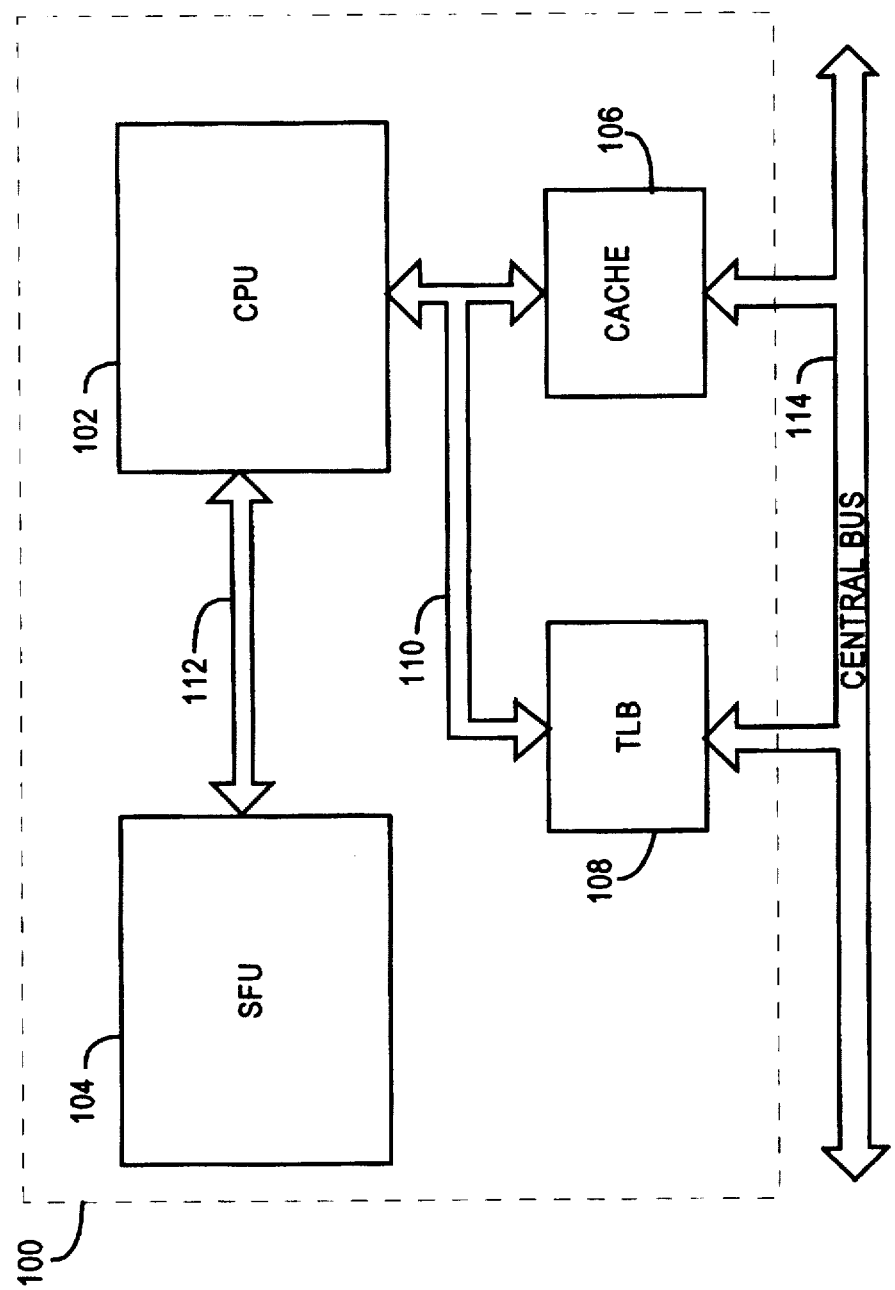
FIG. 1 is a high-level block diagram of the computer architecture of a processor 100 which supports out of order instruction execution.

FIG. 1 is a high-level block diagram of the computer architecture of a processor 100 which supports out of order instruction execution. Although representative of the type of computer architecture on which the present invention may test and verify strongly ordered instruction handling, the computer architecture of processor 100 is not intended in any way to limit the use of the present invention. Accordingly, the computer architecture to which the present invention may be applied may include any other computer architecture or multi-processor system which supports out of order instruction execution. The computer architecture shown in FIG. 1 is a model of the PA-8000 RISC chip, manufactured by Hewlett-Packard Company, Palo Alto, Calif. For a more detailed description of the architecture of the PA-8000, see D. Hunt, *Advanced Performance Features of the 64-Bit PA-8000*, Proceedings of COMPCON '95, Mar. 5–9, 1995, pp. 123–128, incorporated herein by reference.

As shown in FIG. 1, processor 100 includes a central processing unit (CPU) 102. The CPU 102 receives instructions and executes them. Depending on the instruction, the CPU may delegate certain work to be completed to a special function unit 104. Special function units are dedicated hardware units optimally designed to perform a given function. The use of special function units substantially increases the performance of a processor. Control signals and associated data may be passed between the CPU 102 and special function unit 104 via bus 112. In addition, certain instructions (e.g., a LOAD or STORE) require data to be accessed. In the computer architecture 100 shown in FIG. 1, all data accessed by the CPU 102 is first moved into a cache 106. Move-in rules are known in the art. Typically, whenever a request for access to a given data item is issued and the cache does not contain the requested data item, the entire page (i.e., block of data) in which the requested data item resides is moved into the cache at the same time. Most modern computer system also support virtual addressing. To support virtual addressing, a translation lookaside buffer (TLB) 108 is typically used to provide virtual to absolute address translations. In operation, the CPU 102 requests a memory address to be accessed on bus 110. The TLB 108 generally includes special hardware that signals a hit when the requested address is in the cache 106 or a miss when the requested address is not in the cache 106. If a TLB miss occurs, special hardware causes the requested address to be moved into the cache 106 via system bus 114. The TLB 108 is also updated at this time via system bus 114. Whether a hit or miss occurs, the data accompanying the memory access request is either returned from (for reads) or sent to (for writes) the cache 106 via bus 110.

Figure 2:
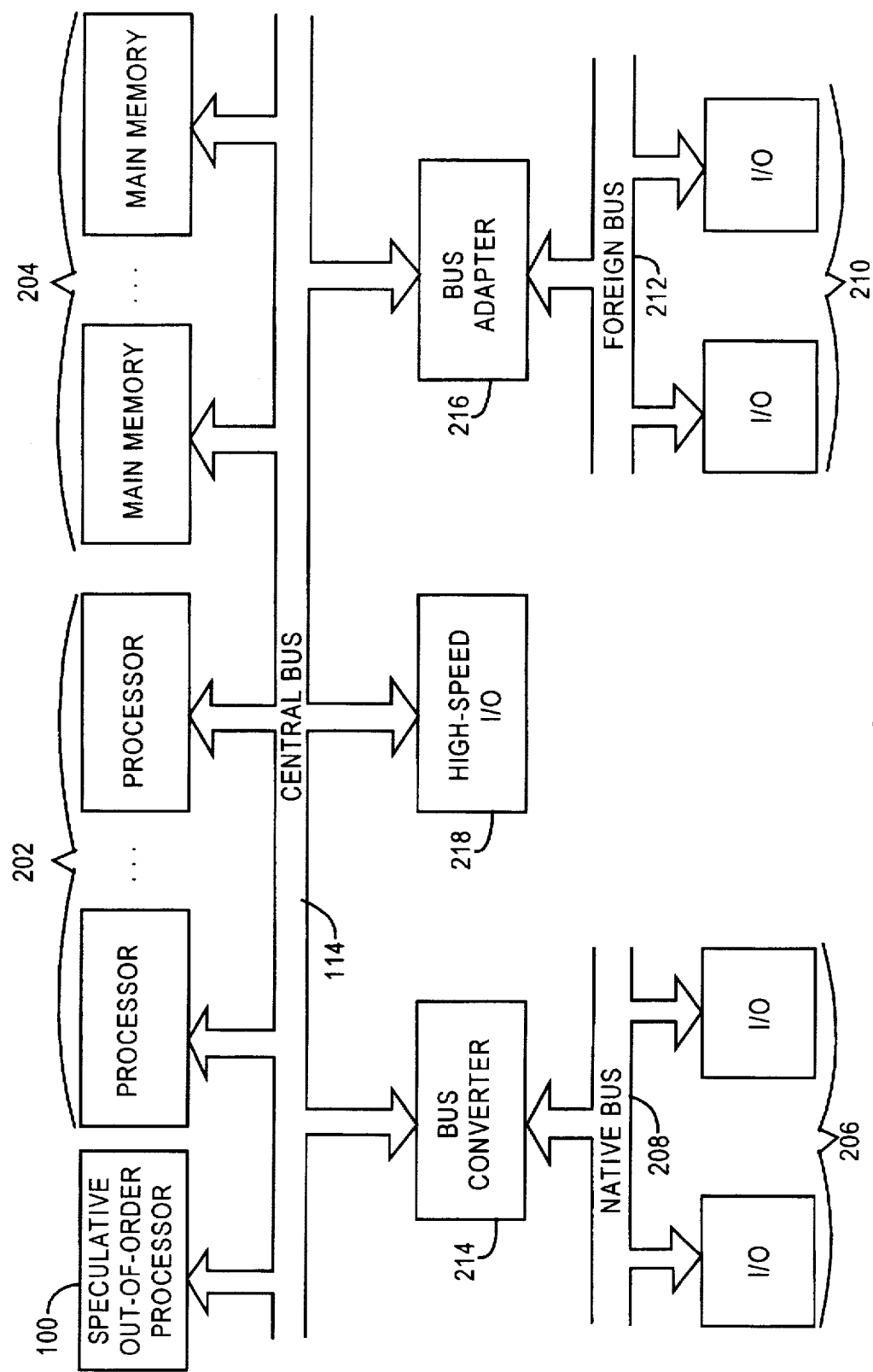
FIG. 2 is a high level block diagram of a multiprocessor system 200 in which the processor 100 of FIG. 1 might operate.

FIG. 2 is a high level block diagram of a multiprocessor system 200 in which the processor 100 of FIG. 1 might operate. As shown in FIG. 2, the multiprocessor system 200 may include the processor 100, a plurality of other processors 202 (which may or may not comprise the same computer architecture of processor 100), a plurality of main memories 204, and a plurality of I/O adapters 206, 210. The processor 100 and other processors 202 access the main memories 204 on the central bus 114 and I/O adapters 206, 210 on remote busses 208, 212. To access the I/O adapters 206, 210 shown in the multi-processor system 200, the processor 100 and other processors 202 must broadcast a request to the address of the I/O adapter it wishes to access. A bus converter 214 or bus adapter 216 recognizes the broadcast address and provides effective communication between the central bus 114 and its associated remote bus 208, 212, respectively. The requested I/O adapter 206 or 210, recognizes its address on the remote bus 208, 212 and responds to the request. The bus converter 214 or bus adapter 216 also responds to requests from the I/O adapters to the processors 100 or 202 to provide effective communication between the remote bus 208, 212 and the central bus 214. In addition, the multiprocessor system 200 may also include high-speed I/O adapters 218. The high bandwidth capability of high-speed I/O adapters 218 allows them to be connected directly to the central bus 114.

The cache 106 of processor 100 functions as a high-speed intermediate storage buffer which contains recently accessed data. As a result, the cache 106 may not be coherent (i.e., containing the same data values in each copy of the memory location) with the main memories 204 at all times. Data is brought into the cache 106 only as a result of references made by the instruction stream. Furthermore, data may be removed from the cache 106 by hardware at any time. To ensure that the main memory gets updated each time the processor changes the value of a copy of a memory location contained in the cache 106, a consistent software view of cache operation requires that implementations never write a clean cache line back to memory. "Clean" may be defined as "not stored into" as opposed to "dirty" which means "stored into". Generally, the cache protocol rules write all dirty cache lines to update the main memory before removing them from the cache. For a detailed description of cache protocol rules, see Papamarcos, infra. While this simple algorithm may suffice in a computer system having only a single processor and main memory, the considerations become much more complex when additional devices such as I/O devices or additional processors may access the same main memory. Thus, in a shared memory system, each device sharing the same main memory must follow a coherency protocol. In the preferred embodiment, each processor supports the MESI protocol, discussed previously. It is clear that testing and verification of a shared memory system in which devices may own local copies of the shared data may become quite complex. It is also clear that the testing and verification of a shared memory multiprocessor system in which one or more processors supports out of order instruction execution becomes even more complex.

Figure 3:
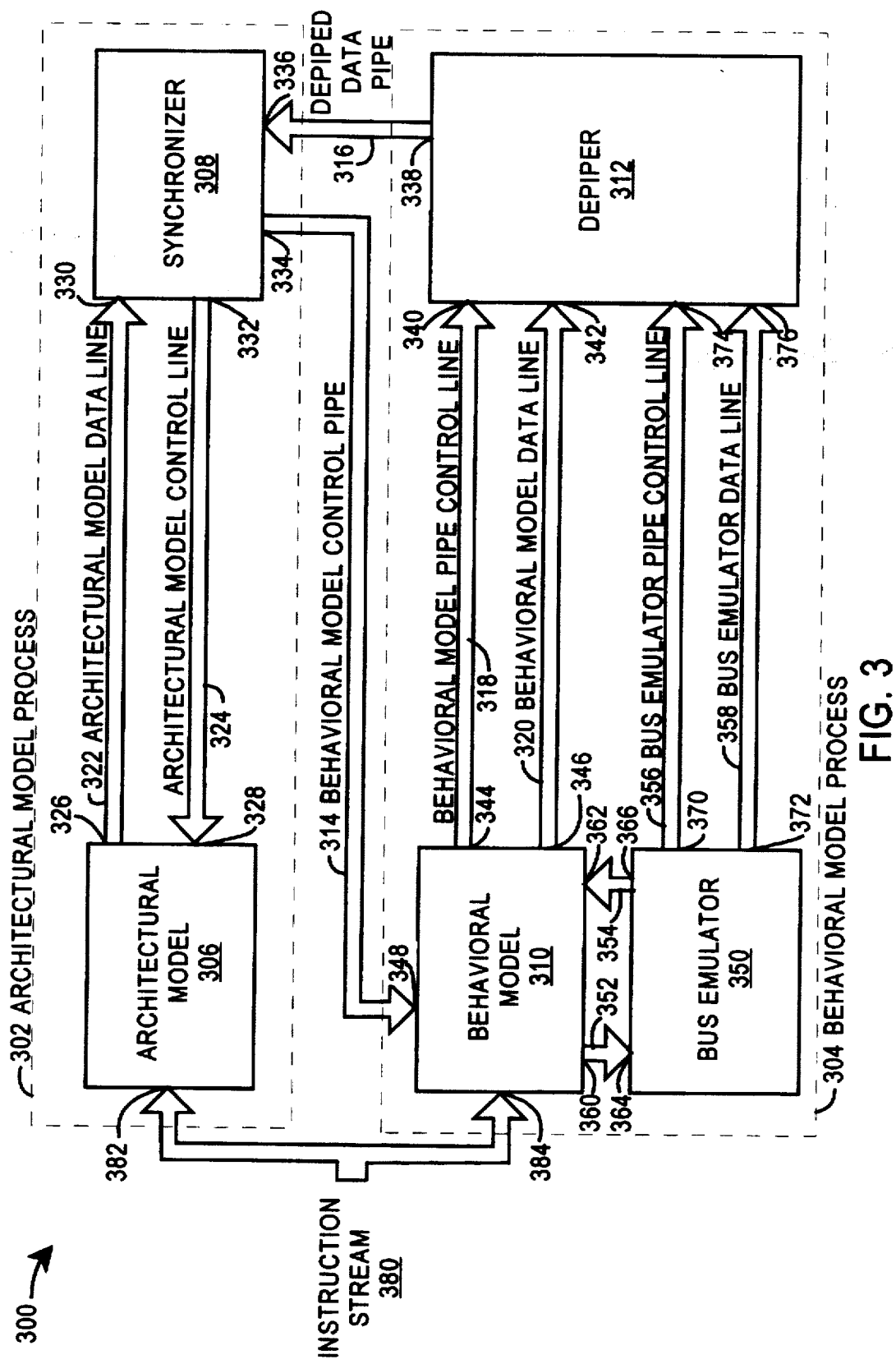
FIG. 3 is a high level system diagram illustrating the structure and interfaces of the preferred embodiment of the present invention.

FIG. 3 illustrates a preferred embodiment of the present invention. In the preferred embodiment, computer-based test system 300 is executed on a Hewlett Packard HP 700 series computer, in a UNIX environment, manufactured by Hewlett-Packard Company, Palo Alto, Calif., USA. However, the present invention can be implemented on any present or future developed computer platform utilizing any present or future developed operating system.

There are two processes in the test system of the preferred embodiment: an architectural model process 302 and a behavioral model process 304. A process is a set of instructions or routines which perform a functionally related task. Embedded within the architectural model process 302 is the architectural model 306 and the synchronizer 308. Embedded within the behavioral model process 304 is the behavioral model 310, the bus emulator 350 and, as a diagnostic block, the depiper 312. Architectural models are well known in the art. For a detailed description of a suitable architectural model, see D. Magenheimer, *The HP Precision Simulator*, Hewlett-Packard Journal, Vol. 37, no. 8, August, 1986, pp. 40–43, incorporated herein by reference. Behavioral models are also well known in the art. For a detailed description of a suitable behavioral model, see Kohlhardt, Gaddis, et. al., *Design, Verification, and Test Methodology for a VLSI Chip Set*, Hewlett-Packard Journal, Vol. 38, no. 9, September 1987, pp. 18–26, incorporated herein by reference. Bus emulators are also well-known in the art. In the present invention, the architectural model 306, the behavioral model 310, and the bus emulator 350 execute concurrently.

In the preferred embodiment, the architectural model 306 models the instruction set of a computer architecture to be verified, such as that of processor 100 in FIG. 1. In alternative embodiments, the architectural model may model other high-level requirements of a computer system, such as input/output requirements. Also, the architectural model 306 may be a verified behavioral model which may or may not model the same architectural implementation as the behavioral model 310 being verified. The architectural model 306 may also be a hardware module which is known to meet the required specifications. The architectural model 306 has an output 326 for transmitting state information resulting from the simulations to synchronizer 308. Architectural model 306 also has input 328 for receiving commands from synchronizer 308.

The behavioral model 310 is an implementation of the computer architecture which is to be functionally verified to conform to the architectural model 306. The behavioral model 310 may take the form of, but not be limited to, a high-level descriptive software model of how a particular hardware module functions. Alternatively, it may take the form of a logic simulation of a tile implementation or a switch implementation of the implementation's transistor network. Moreover, the behavioral model 310 may also be a hardware module which needs to be verified against the presently operational hardware module represented by architectural model 306. The behavioral model 310 has an input 348 for receiving control information instructing the behavioral model when and what to execute, and an input 362 for receiving an external environment input/output (I/O) bus state. The behavioral model 310 contains two outputs; output 344 for transmitting specific information on how data is moving through the pipeline, output 346 for transmitting behavioral model state information to the depiper 312 for translation, and output 360 for transmitting the behavioral model I/O bus state.

The bus emulator 350 is a functional model of the external system environment in which the computer architecture under test operates. The bus emulator 350 emulates the I/O bus states which the external system environment would generate in response to I/O bus states received from the processor under test. For example, with reference to FIG. 2, the bus emulator 350 would emulate the events occurring on the central bus 114 as a result of all the devices connected to it except for processor 100. Accordingly, in the test system 300 of the preferred embodiment, the bus emulator 350 has an input 364 for receiving a behavioral model I/O bus state from the behavioral model 310, and an output 366 for transmitting the external environment I/O bus state. The bus emulator 350 also has an output 370 for transmitting bus emulator state information to the depiper for translation.

In operation, the architectural model 306 and the behavioral model 310 simultaneously receive instructions from an instruction stream 380. The architectural model 306 receives instructions at an input 382 and the behavioral model 310 receives instructions at an input 384.

In the preferred embodiment, the instruction traces of the behavioral model 310 are being compared to those of the architectural model 306. When this technique is utilized in a pipelined implementation, a depiper 312 may be used to convert the pipelined execution trace of the behavioral model 310 and bus emulator 350 into the instruction trace of the architectural model. Translators such as depiper 312 are also well known in the art. The depiper 312 may be a subroutine, separate module, or separate computer, depending on the form of the architectural and behavioral models. For example, if the architectural model 302 processes instructions sequentially and the behavioral model 306 processes instructions in parallel, the depiper 312 may be a deparallizer which translates the behavioral model's parallel output to a sequential form for comparison with the architectural model's state information. In the alternative embodiment of the architectural model and behavioral model being hardware modules, the behavioral model, being developed at a later date to replace the architectural model,
may perform the specified functions quicker and more efficiently. In such a case, depiper 312 may also be a hardware module, having to perform buffering and waiting functions in order to provide the synchronizer 304 with the data necessary to compare with the results of the older, slower architectural model. Depiper 312 contains output 338 for transmitting translated behavioral model state information. Depiper 312 also contains inputs 340 and 342 for receiving control information and behavioral state information, respectively, from the behavioral model 310. Depiper 312 also contains inputs 374 and 376 for receiving control information and behavioral state information, respectively, from the bus emulator 350.

Interprocess communication channels 314 and 316, defined as pipes in UNIX, are used to communicate between the architectural model process 302 and the behavioral model process 304. The behavioral model control pipe 314 conveys commands from synchronizer 308 located in architectural model process 302 to behavioral model process 304. The other interprocess communication pipe is the depiped data pipe 316 which conveys depiped behavioral model data from depiper 312 located in the behavioral model process 304 to the synchronizer 308 located in the architectural model process 302.

Within the behavioral model process 304, depiper 312 receives the behavioral model state information from the behavioral model 310 via behavioral model data line 320. Depiper 312 receives the bus emulator state information from the bus emulator 350 via bus emulator data line 358. The depiper 312 then converts the behavioral model's state information and the bus emulator's state information into a depiped state and transfers the data to synchronizer 308 via depiped data pipe 316. The depiper 312 receives behavioral model pipe control signals from the behavioral model 310 via behavioral model pipe control line 318 and bus emulator pipe control signals from the bus emulator 350 via bus emulator pipe control line 356. Pipe control signals represent the necessary information for the depiper 312 to know when to take the instruction traces from the behavioral model.

The verification process is controlled in real-time by synchronizer 308 which controls architectural model 306 and behavioral model 310 by transmitting commands and state change information via architectural model control line 324 and behavioral model control line 314, respectively. The synchronizer 308 receives requested data and state information from the architectural model 306 and the behavioral model 310 via data lines 322 and 320, respectively. This real-time execution reduces the amount of total simulation time required to verify a particular implementation because the time between each error identification is reduced. In addition, real-time verification reduces the amount of memory required to store intermediate traces during the verification process.

The synchronizer 308 identifies points in the models' executions, instructs each model to simulate to a synchronization point and report relevant state information, and verifies the state information received from the two models in real time and flag errors. A suitable synchronizer for performing the above-described functions which may be used in the present invent is described in detail in U.S. Pat. No. 5,404,496 to Burroughs et al.

Figure 4:
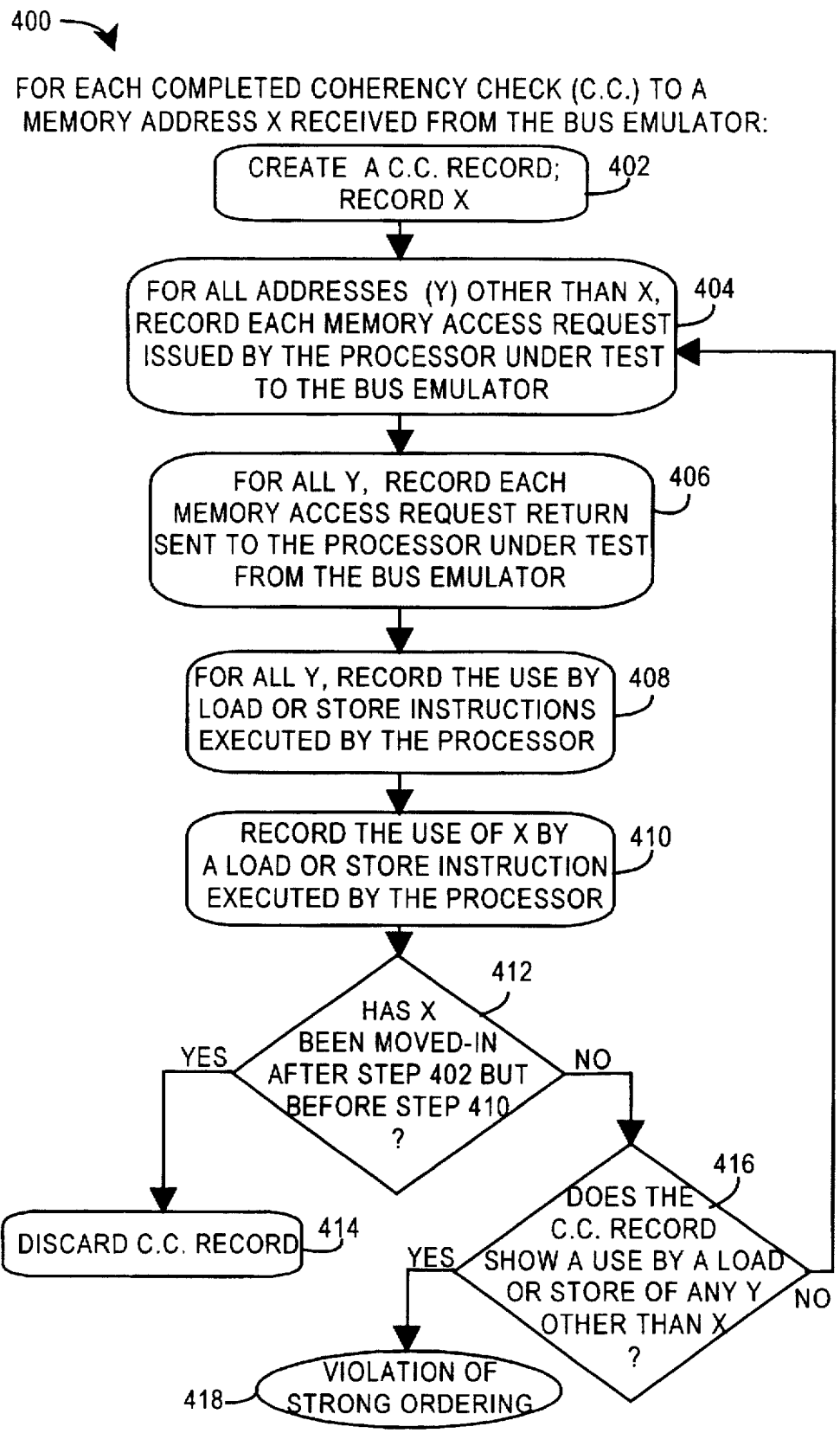
FIG. 4 is a flowchart of a preferred embodiment algorithm for detecting strongly ordered memory access violations.

The synchronizer 308 of the present invention also performs an algorithm to detect architectural violations by the behavioral model 310 of strongly ordered memory accesses. FIG. 4 is a flowchart of a preferred embodiment algorithm for detecting strongly ordered memory access violations. As shown in FIG. 4, the algorithm 400 is performed separately for every coherency check received by the behavioral model 310 from the bus emulator 350 as a result of an exclusive or non-exclusive data access request. Algorithm 400 includes a step 402 of creating a coherency check record and recording the address X requested to be checked for coherency. In a step 404, the address Y of every memory access request issued by the behavioral model 310 to the bus emulator 350 for any cache line other than the coherency check address X is recorded in the coherency check record. The return of all memory access requests for Y are monitored and recorded in the coherency check record in a step 406. In a step 408 the use of all cache lines Y by a load or store instruction from the instruction stream 280 is monitored and recorded in the coherency check record. In a step 410 the use of X by a load or store instruction from the instruction stream 280 is monitored and recorded in the coherency check record. After the use of X in step 410 by a load or store instruction, the algorithm 400 determines in step 412 whether a new move-in of X has occurred yet. If a new move-in of X has occurred, an architectural violation of strongly ordered instructions has not occurred and the coherency check record may be discarded in step 414. If, however, a new move-in of X has not yet occurred, then in a step 416 the synchronizer determines whether a copy of Y has been moved-in and used by the behavioral model. The synchronizer may accomplish step 416 by scanning the coherency check record for any Z, a subset of Y, which were both returned in step 404 and used by the behavioral model in step 406. If any Z exists, then the behavioral model 310 contains an architectural violation of strongly ordered instructions, which may be reported in step 418.

Figure 5:
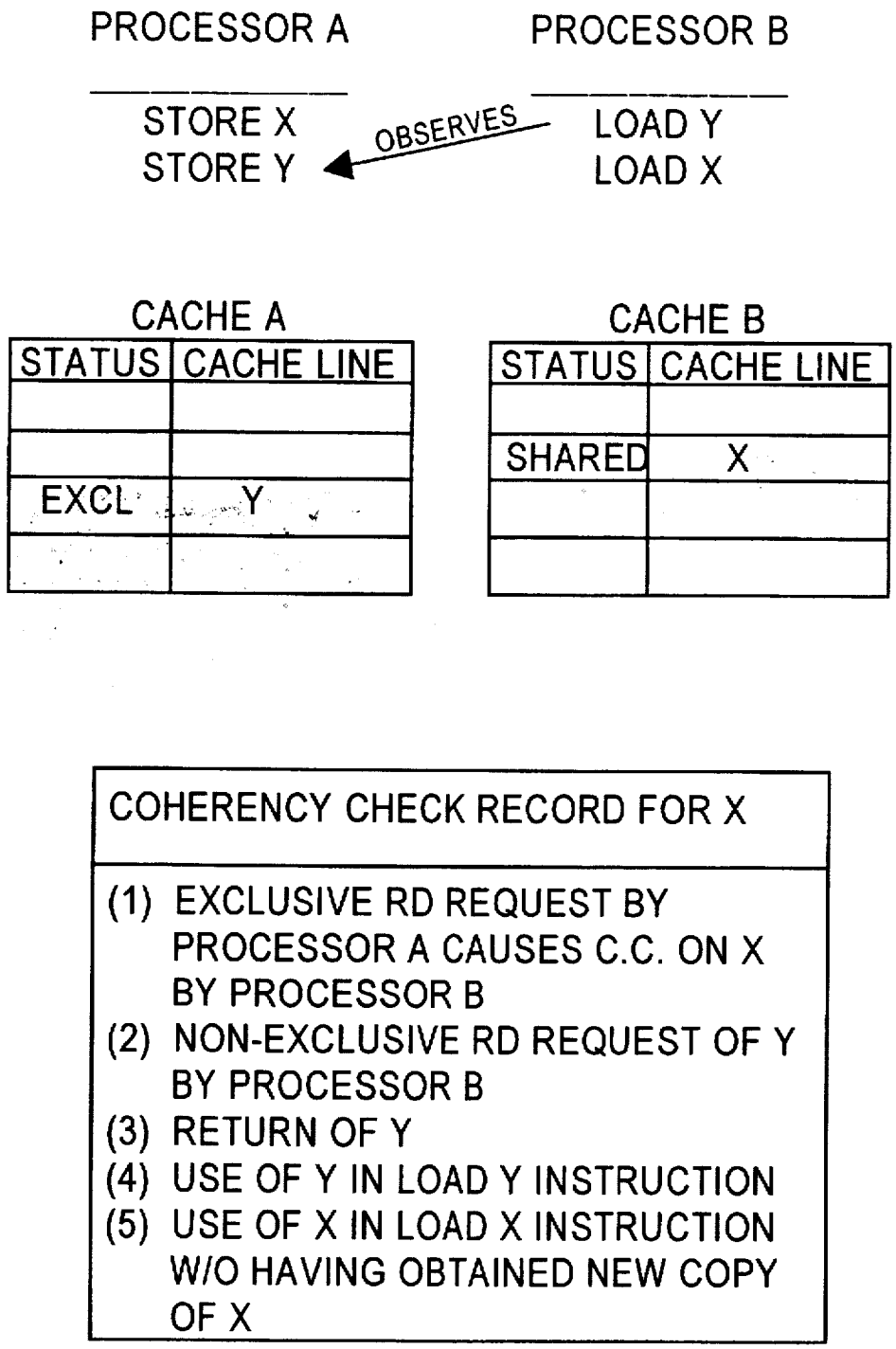
FIG. 5 is a representative example of an instruction stream which illustrates the operation of the present invention.

FIG. 5 is a simple representative example of an instruction stream which illustrates the operation of the present invention. As shown in FIG. 5, processor A must execute instruction "store X" followed by "store Y" and processor B must execute instruction "load Y" followed by "load X". If processor B observes processor A's store to Y, then by definition of strong ordering, processor B must also observe each of the instructions that occur earlier. Accordingly, processor A's store to X must also be strongly ordered so that processor B may rely on the fact that its load of X will observe the new (or "fresh") store value of X from processor A.

As shown in FIG. 5, at the time of execution of the two instruction streams, processor A has an exclusive copy of Y in its cache and processor B has a shared copy of X in its cache. The store of X by processor A causes processor A to issue an exclusive data request to the bus emulator because it needs exclusive access to store to it. The data request requires processor B to perform a coherency check on X. In the meantime, processor B executes the load of Y by issuing a memory access request of Y on the bus. The return from the memory access request of Y results in a cache move-in of Y by processor B. Thus, processor B then has a shared copy of Y in its cache. Then, as shown in FIG. 5, processor B proceeds to execute the load of X instruction. Since the coherency check on X has not completed, processor B uses a stale value of X, resulting in an architectural violation by processor B of handling the strongly ordered instruction STORE X.

FIG. 5 also shows the coherency check record resulting from the above-described events. As shown in the coherency check record, processor B moved in a copy of Y and used Y between the issuance of the coherency check on X and the subsequent use of X without a new move-in of X. Accordingly, the detection algorithm 400 of FIG. 4 performed by the synchronizer 308 will detect the architectural violation of strongly ordered instruction handling by processor B.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system for detecting architectural violations of strongly ordered instructions in a computer architecture under test said computer architecture under test comprising a data cache and supporting out-of-order instruction execution, comprising:

an architectural model which models high-level architectural requirements of said computer architecture and generates correct results under all received instruction test stimuli;

a behavioral model which models said high-level architectural requirements of said computer architecture and executes said received instruction test stimuli according to out-of-order instruction execution behavior defined by said computer architecture;

a bus emulator which modest an external system environment;

a synchronizer which controls the execution of said architectrual model and said behavioral model, matches all out-of-order instruction execution effects, and, for each coherency check issued on a coherency check address to the bus emulator by said behavioral model, performs the steps of:

(i) creating a coherency check record corresponding to said coherency check address and recording said coherency check address in said coherency check record;

(ii) logging each memory request issued by said behavioral model to said bus emulator for any memory address other than said coherency check address;

(iii) logging each respective move-in of a copy of each memory address in step (ii);

(iv) logging each access by the instructions in the instruction stream of each memory address requested in step (ii);

(v) logging each access by the instructions in the instruction stream of said coherency check address; and (vi) if between the issuance of said coherency check on said coherency check address in step (i) and a subsequent access of said coherency check address in step (v) without a new move-in of said coherency check address, said behavioral model moves in a copy of a memory address in step (iii) and accesses said copy, indicating an architectural violation by said behavioral model in handling strongly ordered instructions.

2. The computer-based test system of claim 1, wherein the external system environment comprises a plurality of processors which support out of order instruction execution.

3. A computer-based method for detecting architectural violations of strongly ordered instructions in an implementation or model of a computer architecture which has a data cache and supports out of order instruction execution, the implementation being modeled by a behavioral model, an external system environment being modeled by a bus emulator, and the computer architecture being modeled by an architectural model, the detection being performed by a synchronizer, the computer-based method comprising the steps of:

(1) executing said behavioral model in response to an instructions stream comprising a plurality of instructions, said behavioral model generating a behavioral model state in response to each instruction in said instruction stream, said bus emulator providing an external system environment state in response to each behavioral model state;

(2) executing said architectural model in response to the instruction stream;

(3) synchronizing the execution of the behavioral model with the execution of the architectural model such that the architectural model state and the behavioral model state are synchronous with the external system environment state;

(4) monitoring a coherency check command issued to the bus emulator by said behavioral model and detecting architectural violations of strongly ordered instructions by:

(i) logging a coherency check address;

(ii) maintaining a record of the coherency check address;

(iii) logging each memory request of a memory address issued by the behavioral model to the bus emulator for any address other than the coherency check address;

(iv) logging the return of each memory request in step (iii);

(v) logging each access by the instructions in the instruction stream of each memory address requested in step (iii);

(vi) logging each access by the instructions in the instruction stream of the coherency check address; and (vii) if between the issuance of said coherency check on said coherency check address and a subsequent access of said coherency check address in step (vi) without a new move-in of said coherency check address, said behavioral model moves in a copy of a memory address in step (iv) and accesses said copy in step (v), indicating an architectural violation by said behavioral model in handling strongly ordered instructions.

4. The computer-based method of claim 3, further comprising the steps of:

(5) halting execution of said architectural model and said behavioural model when said synchronizer indicates an architectural violation by said behavioral model in handling strongly ordered instructions.

* * * * *

UNITED STATES PATENT AND TRADEMARK OFFICE
CERTIFICATE OF CORRECTION

PATENT NO.   : 5,794,012
DATED        : August 11, 1998
INVENTOR(S)  : Gregory S. Averill It is certified that error appears in the above-identified patent and that said Letters Patent is hereby corrected as shown below:

In the Claims:

Column 10,
Line 13: After "test" insert --,-- (PTO's error)
Line 24: Delete "modest" and insert therefor --models-- (HP's error)
Line 27: Delete "architectrual" and insert therefor --architectural-- (HP's error)

Column 11,
Line 23: Delete "(iii" and insert therefor --(iii)-- (HP's error)

Column 12,
Line 22: Delete "behavioural" and insert therefor --behavioral-- (PTO's error)

Signed and Sealed this

Thirty-first Day of July, 2001

Attest:

*Nicholas P. Godici*

NICHOLAS P. GODICI
*Attesting Officer*   *Acting Director of the United States Patent and Trademark Office*